United States Patent [19]
Ryan et al.

[11] Patent Number: 6,144,037
[45] Date of Patent: Nov. 7, 2000

[54] CAPACITOR CHARGING SENSOR

[75] Inventors: James G. Ryan, Newtown, Conn.; Badih El-Kareh, Plano, Tex.; Auguste B. El-Kareh, Los Altos Hills, Calif.

[73] Assignees: International Business Machines Corporation, Armonk, N.Y.; Alcedo, Inc., Sunnyvale, Calif.

[21] Appl. No.: 09/099,602

[22] Filed: Jun. 18, 1998

[51] Int. Cl.[7] .................................................. H01J 37/304
[52] U.S. Cl. ................................. 250/492.2; 250/492.1; 250/310; 250/397
[58] Field of Search ............................ 250/492.2, 492.1, 250/397, 310

[56] References Cited

U.S. PATENT DOCUMENTS

| | | |
|---|---|---|
| 4,578,587 | 3/1986 | Behringer et al. ............... 250/492.2 |
| 4,602,981 | 7/1986 | Chen et al. . |
| 4,755,748 | 7/1988 | Lin . |
| 4,801,879 | 1/1989 | Spicer . |
| 4,864,228 | 9/1989 | Richardson . |
| 4,891,584 | 1/1990 | Kamieniecki et al. . |
| 5,030,319 | 7/1991 | Nishino et al. ..................... 156/635 |
| 5,302,828 | 4/1994 | Monahan ........................... 250/307 |
| 5,315,145 | 5/1994 | Lukaszek . |
| 5,391,909 | 2/1995 | Ozdemir et al. . |
| 5,458,732 | 10/1995 | Butler et al. . |
| 5,594,328 | 1/1997 | Lukaszek . |
| 5,602,489 | 2/1997 | El-Kareh et al. . |
| 5,973,323 | 10/1999 | Adler et al. ....................... 250/310 |

*Primary Examiner*—Bruce C. Anderson
*Assistant Examiner*—Nikita Wells
*Attorney, Agent, or Firm*—McGinn & Gibb, P.C.; Daryl K. Neff, Esq.

[57] ABSTRACT

A system for detecting charge accumulation during semiconductor wafer manufacturing including a sensor comprising a capacitor, an emitter for directing a primary electron beam toward the sensor, wherein the primary electron beam causes the sensor to emit secondary electrons and a detector for measuring the secondary electrons.

20 Claims, 8 Drawing Sheets

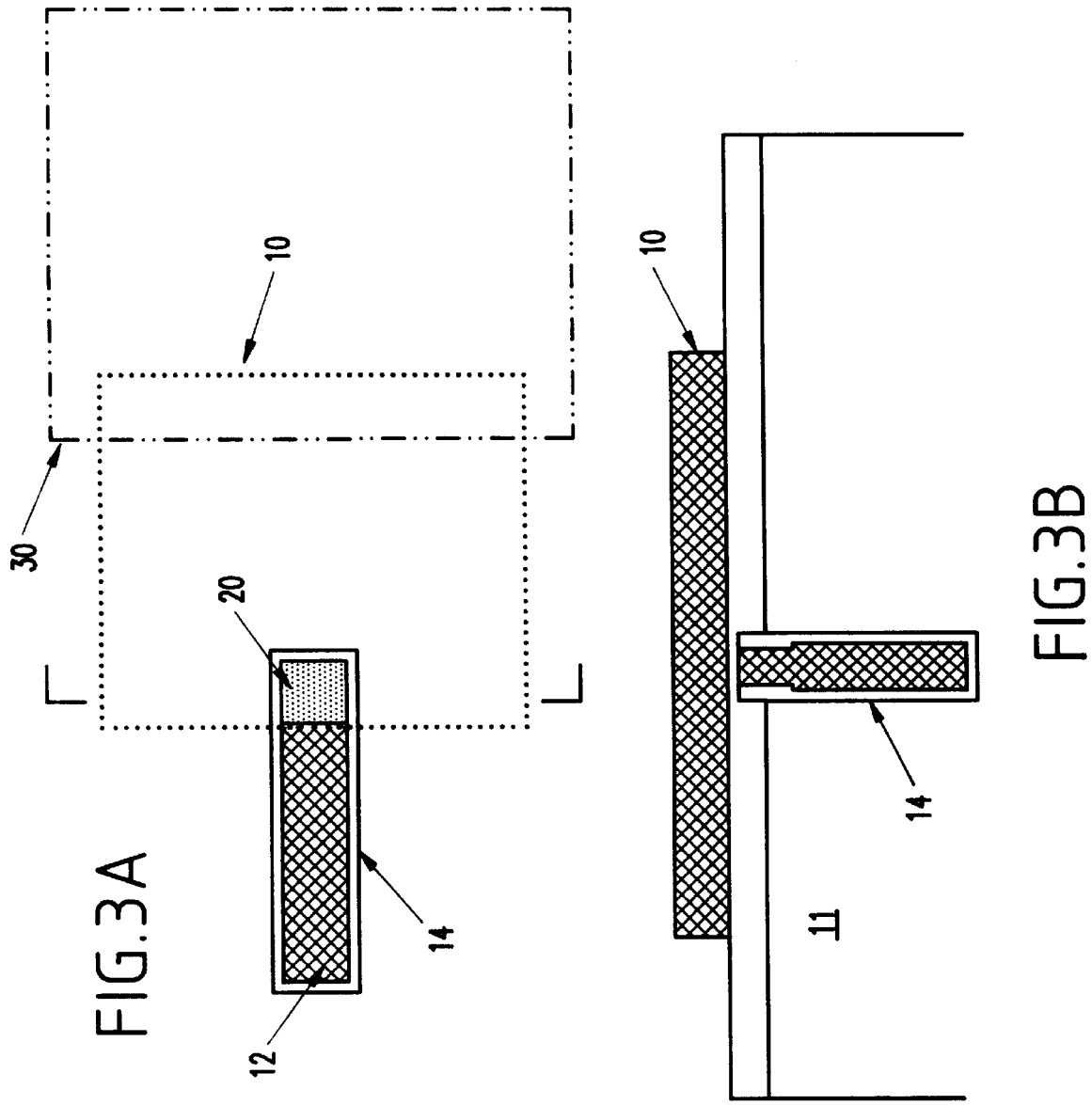

CAPACITOR CHARGING SENSOR

BACKGROUND OF THE INVENTION

1. Field of the Invention

The present invention generally relates to sensors for detecting charging problems during ion implantation and/or plasma processes.

2. Description of the Related Art

During semiconductor wafer manufacturing, ion implantation or plasma-assisted processes may cause positive or negative charges to accumulate on insulators or conductors (e.g., floating conductors) because of non-uniformities in beam and plasma neutrality.

Typical plasma processes include Reactive Ion Etching (RIE) and Plasma Enhanced Chemical Vapor Deposition (PECVD). Use of High-density plasma, such as Electron Cyclotron Resonance (ECR) and Inductive Coupling Plasma (ICP) can exacerbate the problem of charge accumulation. When the charge reaches a critical level of approximately $2 \times 10^{13}$ charges/cm2, the insulator can be permanently damaged.

The charge accumulation problem is amplified by an unavoidable antenna effect caused by antenna ratios of varying magnitudes. The antenna ratio (AR) is the ratio of conductor area of thick oxide to conductor area over thin oxide. Amplification of charge caused by high antenna ratios can damage the gate dielectric at an average surface charge concentration considerably below the critical level.

At the design level, antenna ratios are limited to a maximum of 100:1–400:1 to reduce charge amplification over the thin oxides. Some designs do not allow photoresist masks to overlap the gate conductor (typically a gate stack) to avoid further amplification of charge over thin dielectrics. These precautionary measures are, however, done at the cost of circuit density, speed, and interconnection flexibility.

These undesirable charging effects are referred as "Ion Implantation Charging" or "Plasma Damage". Several tool, integration, and design techniques have been implemented to reduce charging damage. Such techniques include more efficient tuning of plasma conditions and the use of a "Flood-Gun" or "Plasma-Gun" to neutralize the ion beam. Integration techniques, such as the use of buried contacts to provide a leakage path for charges, also reduce the effect of charging. However, such techniques increase processing complexity and decrease circuit performance.

A sensor that simulates the actual wafer being processed and monitors the tool beam and plasma potentials can be used during wafers processing. Such a sensor is placed in the chamber with the wafer during processing to detect any charge accumulation. Conventional systems utilize two types of sensors to detect charging problems.

The first is a MOS and/or MOSFET structure which has different antenna ratios. The second sensor type is based on EEPROM, i.e. MOSFETs with floating and control gates that can be programmed to sense voltages caused by "charging" (CHARM-2) described in U.S. Pat. No. 5,315,145 issued to Wieslaw A. Lukaszeek, entitled "Charge Sensing Device for Use in Semiconductor Wafer Fabrication for Unipolar Operation and Charge Sensing", dated May 24, 1994, incorporated herein by reference.

However, there are drawbacks associated with both of these types of sensors. The MOS/MOSFET sensors detect only oxide and interface degradations and relate these degradations to the presence of charges without providing information on the magnitude of charge and on potential distributions. Also, the structures are only accessible after some level of processing and are typically not reusable.

While CHARM-2 sensors are reusable and detect potential distributions across the wafer, they require complex processing of the EEPROM structures. Also, these structures contain layers and surfaces different from those of the actual product. In other words, CHARM-2 sensors do not closely simulate the wafer being produced. Another disadvantage of CHARM-2 is the wafer size. Presently, only 150-mm wafers are available. Preparing 200–300 mm CHARM-2 wafers is costly.

SUMMARY OF THE INVENTION

It is, therefore, an object of the present invention to provide a structure and method for using a sensor that simulates the actual process and monitors the tool beam and plasma potentials of the wafers being manufactured.

More specifically, the invention comprises a system for detecting charge accumulation during semiconductor wafer manufacturing and includes a sensor comprising a trench or stacked capacitor, an emitter for directing a primary electron beam toward the sensor, wherein the primary electron beam causes the sensor to emit secondary electrons, and a detector for measuring the secondary electrons.

An amount of the secondary electrons and an energy level of the secondary electrons detected by the detector indicates a charge accumulation of the sensor. The electron-beam is also used to neutralize the sensor.

The capacitor comprises at least one of a stacked capacitor and a trench capacitor. The trench capacitor comprises a substrate, a trench within the substrate, a first dielectric lining the trench, an inner plate over the first dielectric and filling the trench and a second dielectric covering the substrate, wherein the inner plate extends through the second dielectric. The stacked capacitor comprises a substrate, a first dielectric over the substrate, a first conductive layer over the first dielectric, a second dielectric layer over the first conductive layer; and a second conductive layer over the second dielectric layer. The capacitor further includes a tunneling oxide and a resist covering at least a portion of the capacitor.

The sensor includes a structure having similar charging characteristics as a semiconductor wafer being manufactured during the semiconductor wafer manufacturing, such that charge accumulation of the sensor approximates charge accumulation of the wafer being manufactured.

The invention also includes a method for sensing charge accumulation on semiconductor wafers during production comprising positioning a sensor in a semiconductor wafer production chamber, initiating a manufacturing process in the chamber, directing a primary beam of electrons at the sensor during the manufacturing process, wherein the primary beam causes the sensor to emit secondary electrons, and measuring the secondary electrons emitted by the sensor.

The step of positioning the sensor comprises a step of positioning a trench capacitor in the chamber. The measuring step further comprises a step of determining a charge of the sensor based on an amount of the secondary electrons and an energy level of the secondary electrons. The step of directing a primary electron beam comprises a first step of activating an electron gun and the method further comprises a second step of activating the electron gun for eliminating charge accumulation on the sensor.

The step of positioning the sensor comprises a step of positioning, in the chamber, a trench capacitor comprising a substrate, a trench within the substrate, a first dielectric lining the trench, an inner plate over the dielectric and filling the trench, a second dielectric covering the substrate, wherein the inner plate extends through the second dielectric.

The step of positioning the sensor comprises a step of positioning, in the chamber, a trench capacitor having similar charging characteristics as a semiconductor wafer being manufactured in the chamber, such that charge accumulation on the sensor approximates charge accumulation on the wafer being manufactured. The trench capacitor may also comprise a tunneling oxide over the inner plate. The manufacturing process includes at least one of etching and deposition.

Thus, with the invention, the capacitor will provide an accurate indication of charge accumulation of the wafers being produced through the emission of secondary electrons upon the application of a fine electron beam.

BRIEF DESCRIPTION OF THE DRAWINGS

The foregoing and other objects, aspects and advantages will be better understood from the following detailed description of a preferred embodiment of the invention with reference to the drawings, in which:

FIG. 3(a) is a schematic diagram of a top view of the inventive sensor device including a gate conductor and photoresist.

FIG. 3(b) is a schematic diagram of a cross-sectional view of the inventive sensor device including a gate conductor and photoresist.

DETAILED DESCRIPTION OF A PREFERRED EMBODIMENT OF THE INVENTION

Figure 1B:
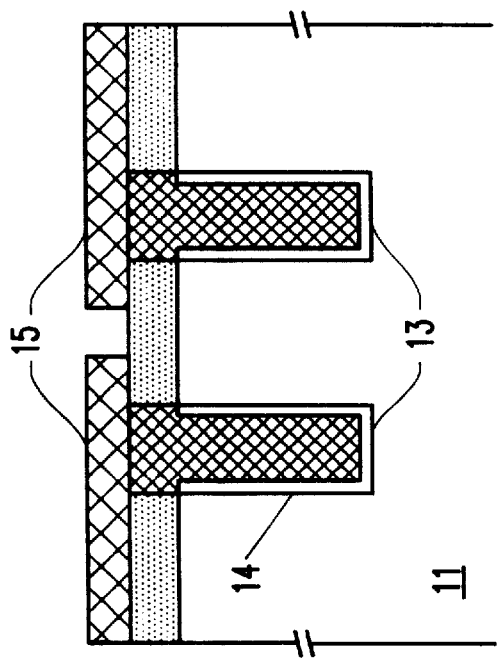
FIG. 1(b) is a schematic diagram of a cross-sectional view of the inventive sensor device shown in FIG. 1(a) and including a conductor.

Referring now to the drawings, and more particularly to FIGS. 1–3, elements of the inventive structure are illustrated. Generally, FIGS. 1–3 illustrate different embodiments of the inventive sensor device which comprises, for example, floating (e.g., insulated) deep trench capacitors which are used in conjunction with an electron beam to precisely determine excess charge accumulation.

The inventive sensor device is utilized during the actual wafer manufacture processes (e.g., deposition or etching). Therefore, the sensor is placed in the chamber while the etching and/or deposition is being performed on the wafers. Periodically, the sensor is moved to a location adjacent an electron analyzer and a fine electron beam is applied to the sensor. The secondary electrons sensed by the electron analyzer allow the charged condition of the sensor (and that of the corresponding wafers being manufactured) to be known with high accuracy.

Figure 1A:
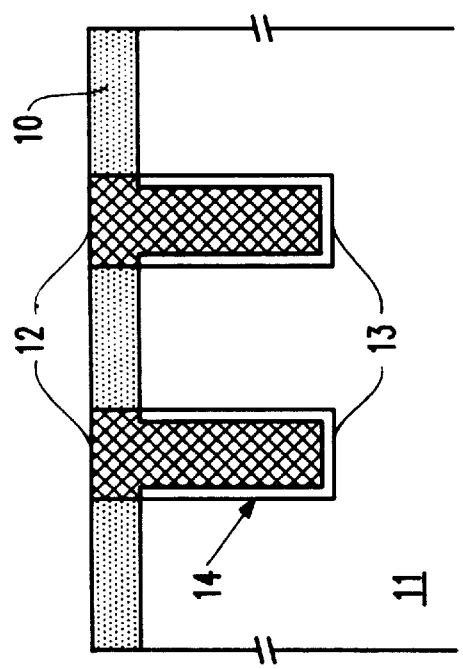
FIG. 1(a) is a schematic diagram of a cross-sectional view of the inventive sensor device.

A preferred embodiment of the inventive sensor comprising deep trench capacitors 14 is illustrated in FIG. 1(a). To form such deep trench capacitors, a thick insulator 10 (typically 250–850 nm oxide) is grown or deposited on a wafer 11. Techniques well known to those ordinarily skilled in the art are used to etch deep trenches through the thick oxide 10 to a certain depth in the silicon wafer 11.

A thin dielectric 13 is grown and a conductor 12 (e.g., an inner plate), are deposited in the trench 14 and are then planarized to produce the structure illustrated in FIG. 1(a). The conductor 12 is preferably doped polysilicon, although other conductors are also applicable, as is well known to those ordinarily skilled in the art. The depth of the trench 14 ranges typically from 5–10 $\mu$m and the thickness of the thin dielectric 13 ranges from 5–20 nm.

Figure 1C:
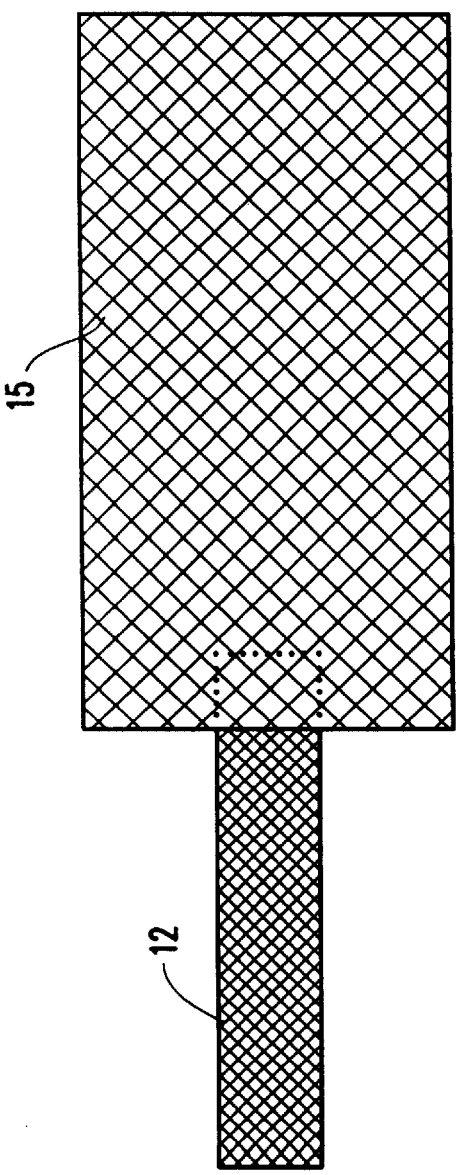
FIG. 1(c) is a schematic diagram of a top view of the inventive sensor device shown in FIG. 1(b)

As shown in FIGS. 1(b) and 1(c), a second conductor 15 (such as doped polysilicon) could be patterned over the exposed trenches 14. The second conductor 15 acts as an antenna for the inner plate conductor 12.

As discussed above, the ratio of the conductor area 15 over the thick oxide 10 to the area of the inner trench plate 12 covering the thin dielectric 13 is referred to as the "antenna ratio". The antenna ratio of the inventive sensor is designed to match the antenna ratio of the chip being manufactured so that the inventive sensor can accurately indicate the charging condition of the wafers being manufactured.

Charge amplification depends on the ratio of thick 12 to thin oxide 13 thicknesses and on the antenna ratio. As mentioned above, charge that is collected by the top conductor layer 15 (e.g., the antenna) is amplified over the thin trench dielectric 13. Therefore, the ratio of thick to thin oxide thickness and the antenna ratio of the sensor is preferably adjusted to ensure that the thin oxide of the inventive sensor does not get damaged during testing.

The inner plate 12 can retain a charge for a long time, actually days, if maintained in a dry un-ionized atmosphere, since there is no junction connected to the inner plate. There is typically negligible leakage through the inner plate.

Figure 2A:
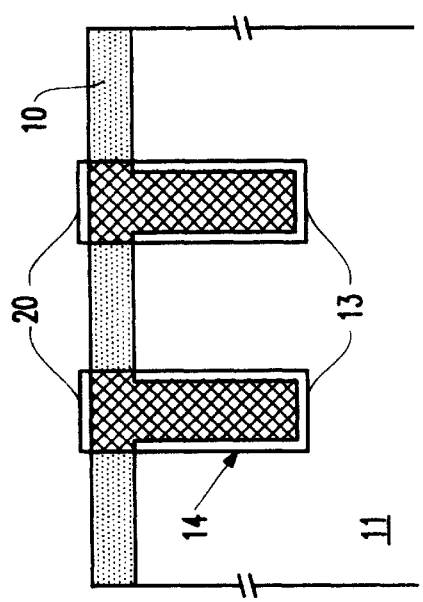
FIG. 2(a) is a schematic diagram of a cross-sectional view of the inventive sensor device shown in FIG. 1(a) and including a tunneling oxide.
Figure 2B:
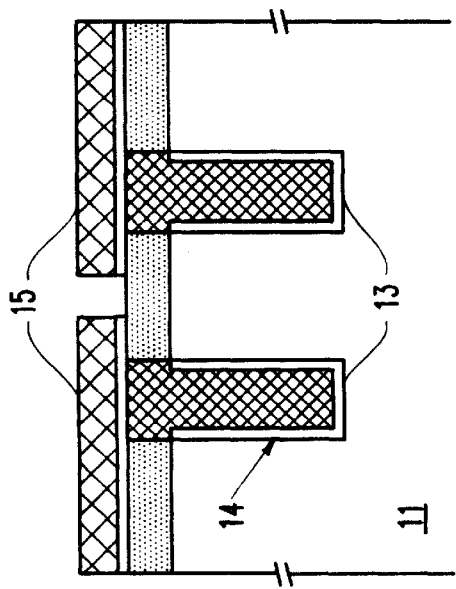
FIG. 2(b) is a schematic diagram of a cross-sectional view of the inventive sensor devices shown in FIG. 2(a) and including a conductor.

FIGS. 2(a) and 2(b) illustrate a second embodiment of the invention. More specifically, FIGS. 2(a) and 2(b) show a variant of the structure shown in FIGS. 1(a) and 1(b). In FIGS. 2(a) and 2(b) a thin tunneling oxide 20 is formed on the top of the inner plate 12. When the charge is sufficiently high, the field across the tunneling oxide 20 will give rise to a tunneling current, which will charge the inner plate 12.

The tunneling oxide 20 provides the option of controlling the charge that accumulates in the trench. Further, the charging process is self-limiting. Therefore, as charge accumulates, the electric field in the oxide decreases. To the contrary, conventional EEPROM sensors only utilize a tunnel oxide as a path to write or erase the "cell" and do not perform the self-limiting charge control as in the invention.

Further, conventional structures use a tunnel oxide to charge floating gates in EEPROM and MOSFETs sensors, where charge is sensed by measuring the current-voltage characteristics of metal insulated semiconductor field effect transistors (MISFET).

To the contrary, the inventive tunnel oxide limits the charge accumulating in the trench capacitor. Further, with the inventive tunnel oxide 20, the charging is a self-limiting process because the tunnel current decreases as the charge in the capacitor increases.

Asperities on the top surface of the trench polysilicon 13 also serve to reduce the voltage on the inner plate 12.

Figure 2C:
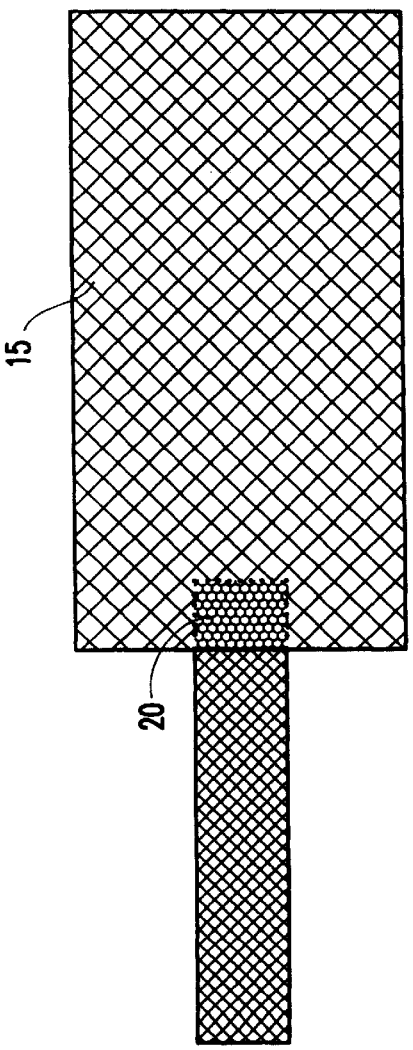
FIG. 2(c) is a schematic diagram of a top view of the inventive sensor device shown in FIG. 2(b)

As shown in FIGS. 2(b) and 2(c), this embodiment of the invention can also utilize the second conductor 15 and tailor the antenna ratio to limit the plasma charge that passes through the tunnel oxide 20. The combination of adjusting the antenna ratio and using the tunnel oxide 20 gives another degree of freedom in controlling the charge that accumulates in the trench capacitor.

FIGS. 3(a) and 3(b) illustrate another embodiment of the invention and show a similar structure as illustrated in FIGS. 1(a)–2(c) which includes a patterned photoresist 30 overlapping the top polysilicon collector 10. The resist surface 30 can become conductive and capacitive coupling can cause the potential in the underlying polysilicon to rise or fall, depending on charge polarity.

During testing with the inventive sensor, the resist area is varied to study the sensitivity of charging which may also effect the polysilicon "antenna ratio". By utilizing such a resist 30, the inventive sensor can more accurately simulate the charging affects which will occur on actual production wafers, which commonly include resist patterns, e.g. during ion implantation. The size and shape of the resist should parallel that which is used in the actual wafer production. The resist sidewall can also become conductive, causing the charge to redistribute between resist and underlying conductor.

As illustrated in FIGS. 4–7, the inventive charge sensing is accomplished, in a preferred embodiment, with a fine beam of electrons. By using a fine beam of electrons, the charge of the inner plate 12 of the trench (or a group of trenches) or of the collecting top plate 15 that connects to one or several of the trench capacitors can be sensed directly.

The resulting secondary electrons, which are produced by the electron beam directly, indicate the relative capacitance, differences in surface voltages and the presence or absence of a charge. More specifically, the energy of the secondary emitted electrons depends on the charge, capacitance or potential of the surface which is being bombarded (e.g., the inventive sensor). By analyzing the energy of the secondary electrons, a measurement of the surface potential, charge distribution or capacitance can be made.

The inventive electron beam detection method operates using the secondary emission yield. This is the ratio of the number of secondary emitted electrons to the number of primary electrons landing on the target (e.g, see FIG. 4).

If the presence of a charge is to be determined, or if the relative magnitude of that charge is to be determined, the electron beam can be selectively directed to the area to be tested. The beam can detect the presence of the charge using the procedure outlined above.

In a preferred embodiment, the target (e.g., the inventive sensor—FIGS. 1(a)–3(b) is floating with respect to ground (i.e., the wafer is insulated while being bombarded by an electron beam). A collector (e.g., FIG. 7) is placed in the vicinity of that sensor at a voltage sufficiently positive to attract electrons. The spot size of the electron beam is typically about 5 microns in diameter. During flood, the beam can be designed to cover a large area simultaneously.

Figure 4:
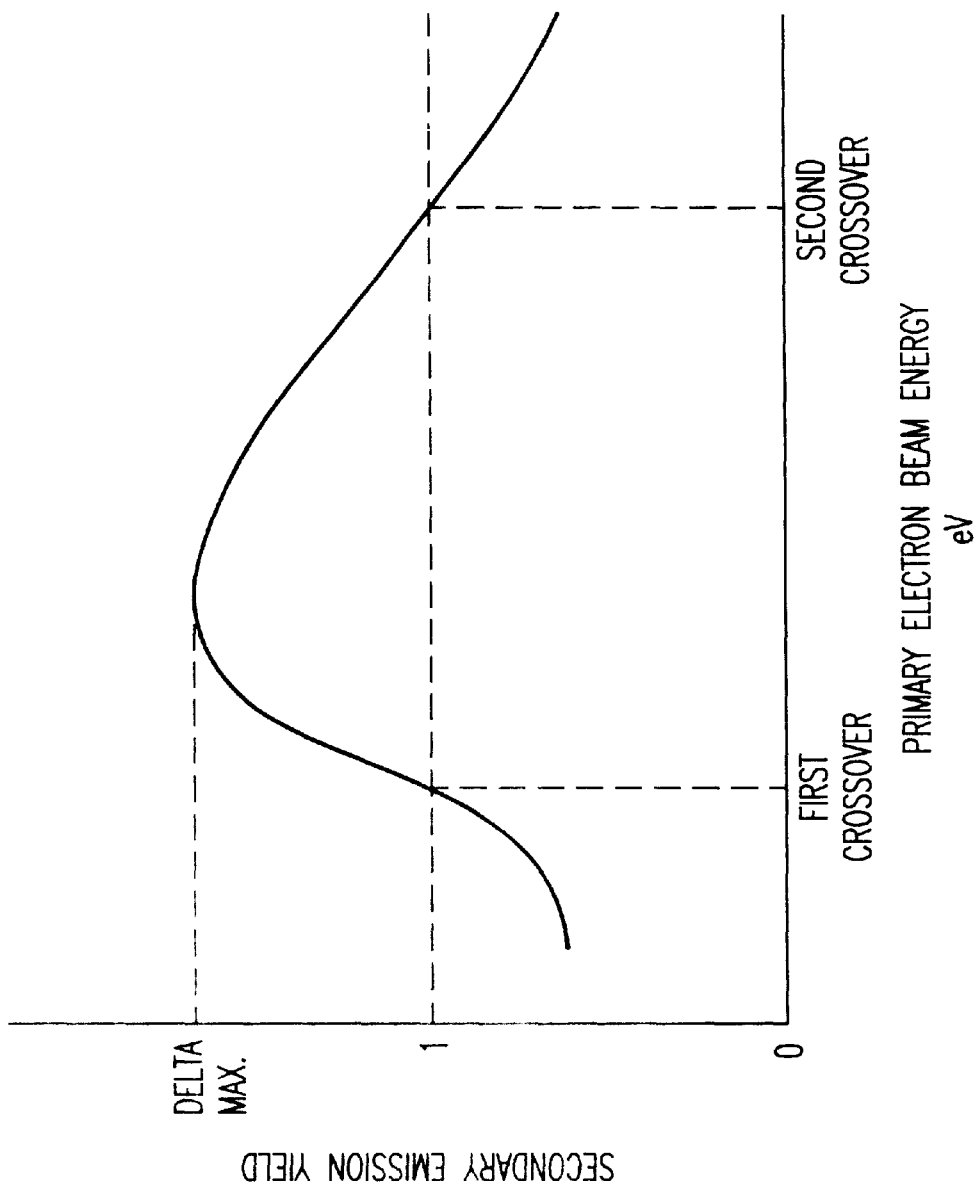
FIG. 4 is a graph showing the secondary emission yield of a primary electron beam.

In FIG. 4, the secondary emission yield, $\delta$, is plotted as a function of the energy of the primary fine electron beam landing on the sensor. The variable $\delta$ is the ratio of the number of secondary emitted electrons to the number of primary electrons. Although the values of $\delta$ vary from material to material, the general shape of the graph is the same as that shown in FIG. 4.

Initially the value of $\delta$ is below 1. That is because the energy of the primary beam is not enough to dislodge a large number of secondaries. As the energy of the primary beam increases, the value of $\delta$ increases. However, as the energy of the primary beam increases further, the primary electrons penetrate deeper into the sensor and, although more secondaries are dislodged, fewer reach the surface and the value of $\delta$ starts to decrease.

There are two important points on this curve where the value of $\delta=1$. They are referred to herein as the first and second crossover points. When the primary electron beam lands on the sensor with an energy such that the secondary emission yield is less than 1 (e.g., below the first and second crossover points), the sensor will acquire more electrons than it loses and it will eventually be negatively charged. If the secondary emission yield is greater than 1 (e.g., below the first and second crossover points), the secondary emitted electrons are collected by the collector and the sensor will lose electrons and, therefore, be positively charged. If the yield equals 1, the number of primary electrons which land on the sensor is equal to the number of secondary electrons which leave and, therefore, no net charge occurs.

With respect to measurement of relative capacitance, the switch grid potential method can be utilized. This method is described in detail in U.S. Pat. No. 5,602,489 entitled "Switch Potential Electron Beam Substrate Tester" to El-Kareh et al., which is incorporated herein by reference.

Briefly, in the switch grid potential method, the following steps occur. The electron beam hits an area which is to be checked (i.e., the sensor) while an extract grid above it is maintained at a positive potential, typically +10 volts. If the beam is landing at 1 keV energy, the secondary emission yield will be greater than 1. Therefore, the pad will eventually reach an equilibrium which is somewhat more positive than the extract grid, typically +12 volts.

While the beam is landing on the pad, the extract grid is switched to a negative potential, typically −10 volts. The pad will now charge negatively until, at equilibrium, the pad reaches a negative potential somewhat less negative than the extract grid potential, typically −8 volts. The speed with which the pad changes from one state to the other depends to a great extent on the capacitance of the area being addressed.

Conversely, the switch grid potential method could start with the grid at a negative potential and then switch to a positive potential. Additionally, the substrate could be mounted on a conductive base which is biased at a positive or negative potential and which is switched to the opposite potential during testing.

While a preferred embodiment of the invention uses a fine beam of electrons to detect the charging condition of the sensor, other techniques can also be used to sense the presence of charge, such as capacitive coupling between an AFM (Atomic Force Microscopy) probe and substrate, as would be known to one ordinarily skilled in the art given this disclosure.

When using an AFM probe, the presence of charge modifies the surface potential of the substrate 11 surrounding the trench 14, and hence the total capacitance between the inner plate 12 and substrate 11. The potential of the inner plate 12 can be inferred from the measured capacitance.

Other capacitive or Kelvin probe techniques can also be used with the invention, as would be known to one ordinarily skilled in the art given this disclosure. Any of the above sensing methods can be used with the inventive capacitor sensors to determine the charge accumulation on a wafer during wafer production.

The invention also provides for charge erasure. The potential of the inner capacitor plates can be reset to zero with the fine electron beam system described above. For example, a flood gun can be used to "erase" a charge. A flood gun sprays electrons of a given energy over the entire surface. For example, the electron gun which emits the fine electron beam to the inventive sensor could be used as the flood gun.

Depending on the polarity of the charge, the energy is chosen so that the secondary emission yield can either be greater or smaller than 1. Generally, during removal of charges with a flood gun, the extract grid is set to 0 V. Experimentally the inventors found that the substrate reaches an equilibrium potential somewhat more positive than the extraction grid. This offset can be compensated by readjustment of the extraction screen potential.

Figure 5:
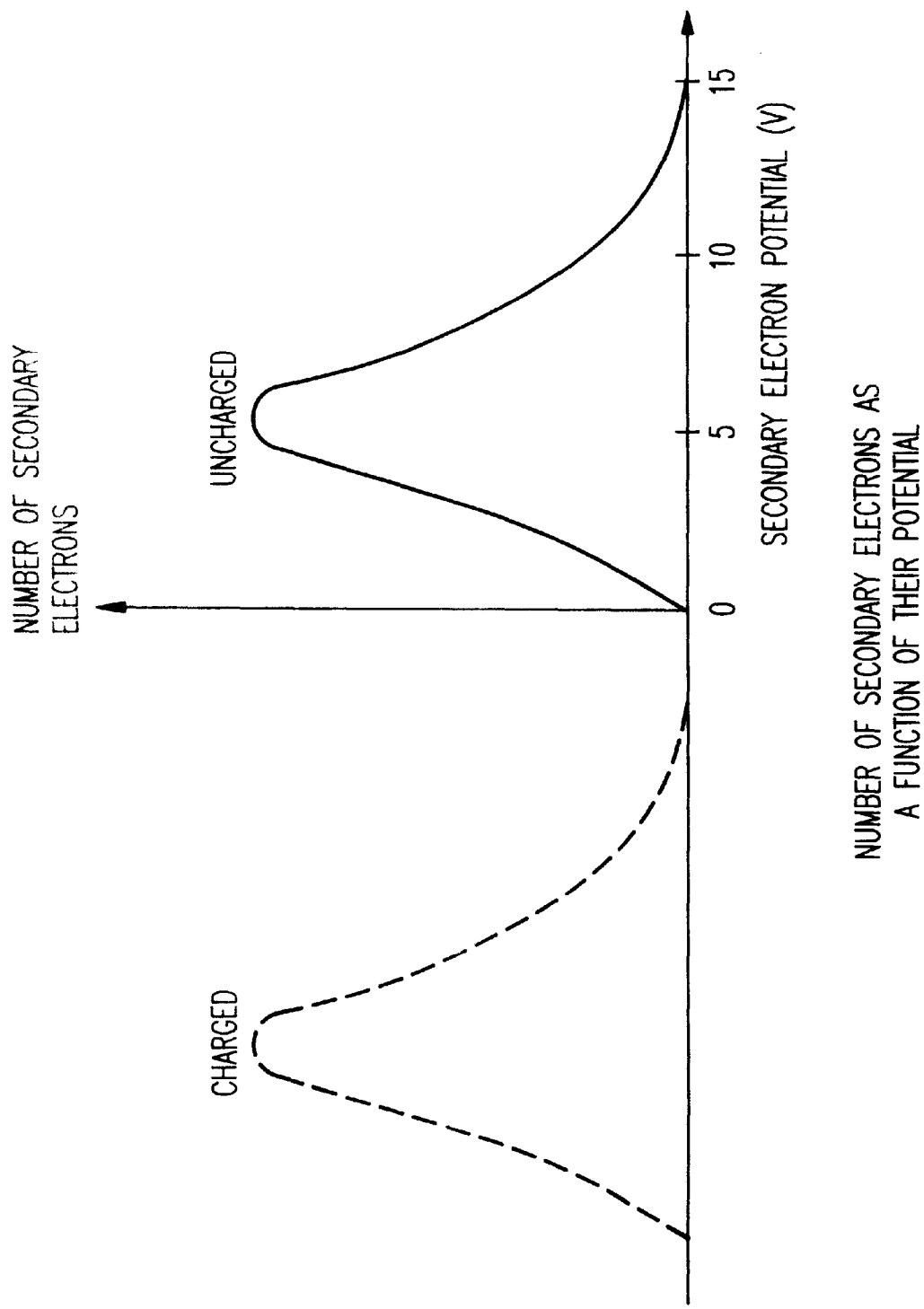
FIG. 5 is a graph showing a number of secondary electrons as a function of their potential.

FIG. 5 illustrates an example of the relative difference between secondary electrons emitted from a surface with a charge and without charge. The energy distribution of the secondary emitted electrons is dependent on many factors. One of them is the voltage of the surface (sensor) being bombarded by the primary electron beam relative to the collector voltage. The voltage of the collector is directly dependent on the capacitor and the charge of the sensor.

Figure 6:
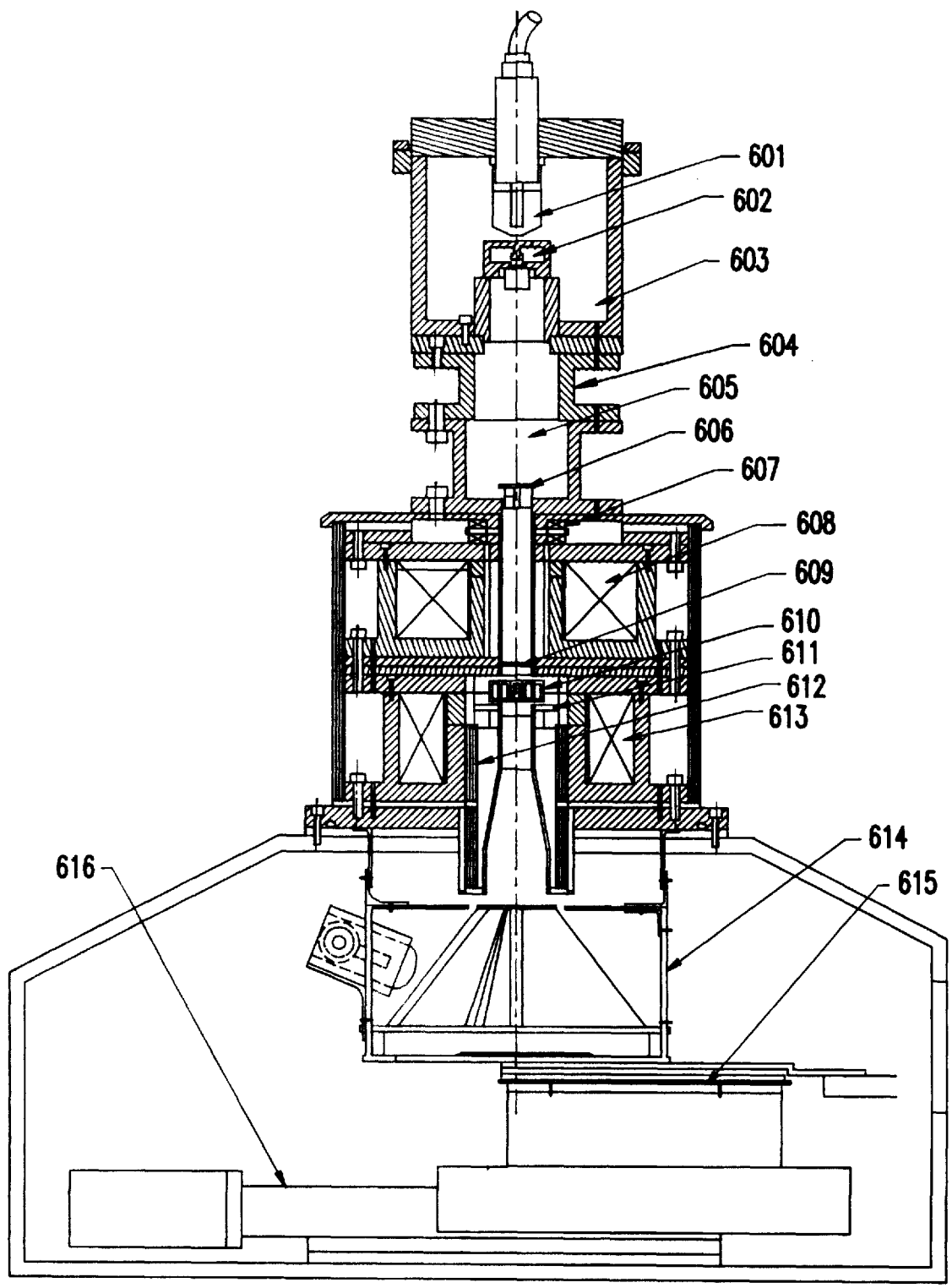
FIG. 6 is a schematic diagram of a cross-sectional view of a column and chamber.

FIG. 6 illustrates an example of the electron beam column which can be used transmit such a fine electron beam. It includes a source 601, anode assembly 602, source chamber 603, isolation valve 604, upper pump assembly 605, intermediate aperture assembly 606, alignment coils 607, condenser lens 608, lower aperture assembly 609, stigmator assembly 610, dynamic focus unit 611, deflection coil 612, focus lens 613, analyzer assembly 614, substrate area 615 and x-y stage 616.

Figure 7:
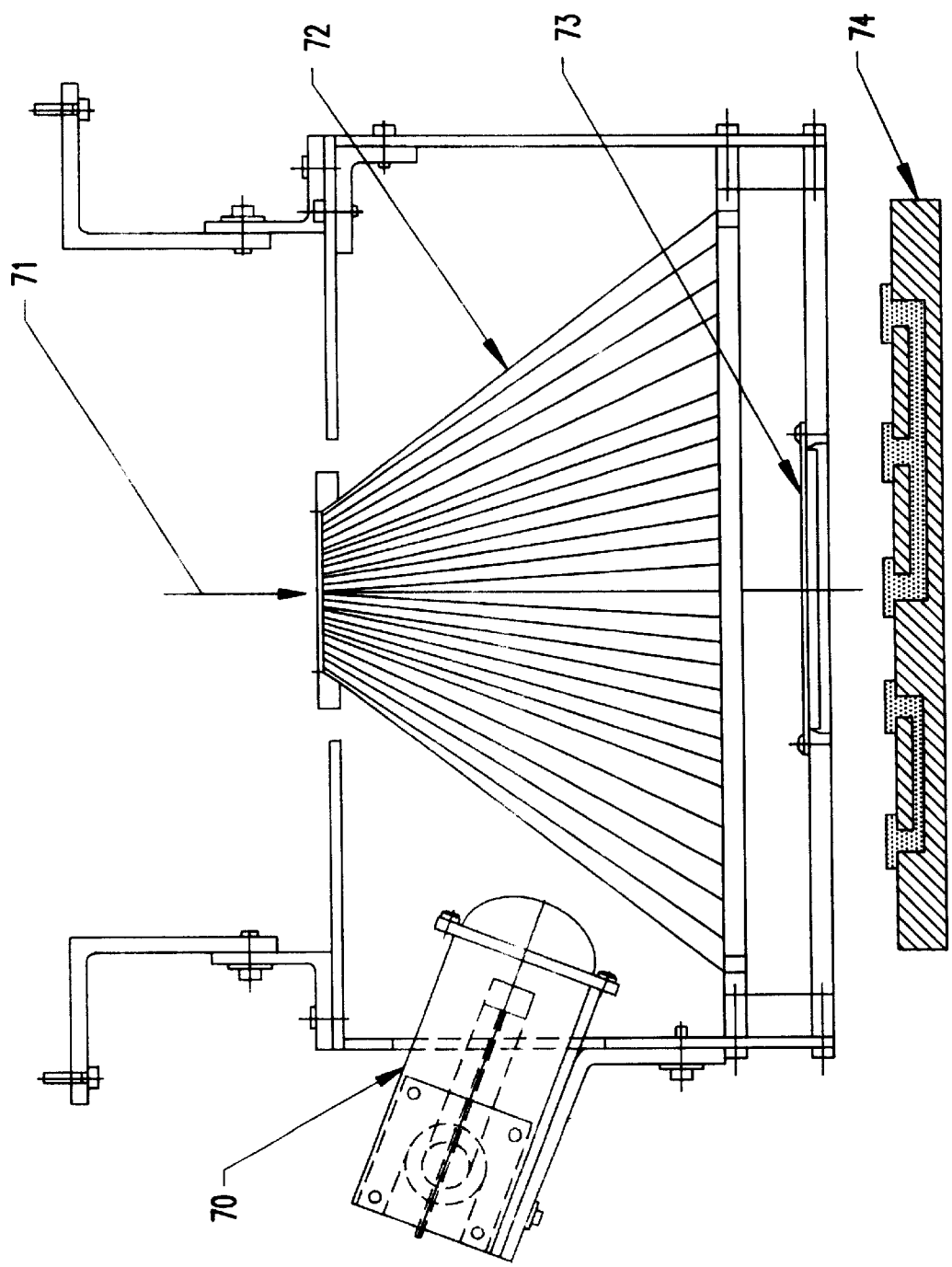
FIG. 7 is a schematic diagram of a cross-sectional view of a secondary electron analyzer.

FIG. 7 illustrates a detector for analyzing the emitted electrons which includes a detector 70, an area where the electron beam 71 is received, a conical retard grid 72, an extraction grid 73 and an area for the substrate 74.

The function and operation of such an electron beam column and detector and their components are well known to those ordinarily skilled in the art and are not discussed herein for sake of brevity.

While the invention has been explained with reference to an exemplary trench capacitor, the invention is equally applicable to a stacked capacitor cell, as would be known to one ordinarily skilled in the art given this disclosure.

Figure 8:
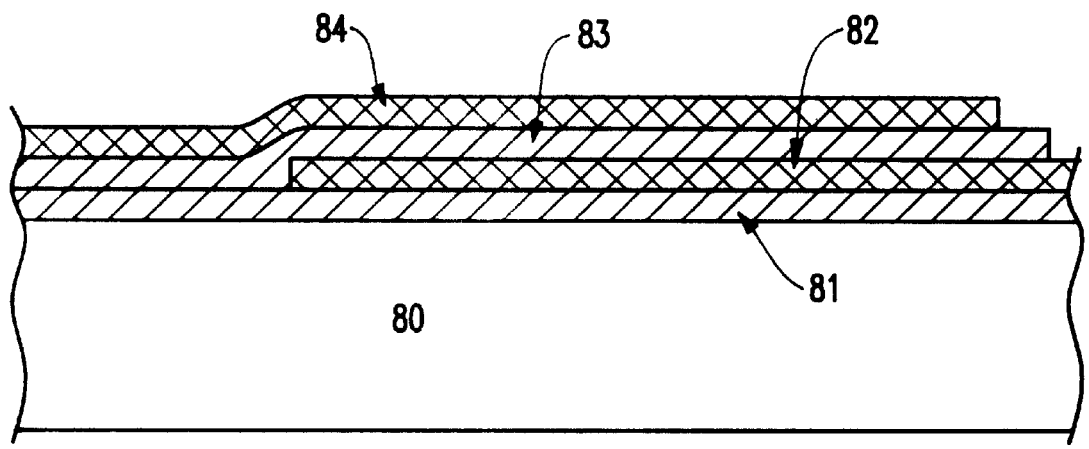
FIG. 8 is a schematic diagram of a stacked capacitor.

For example, a stacked capacitor of the invention illustrated in FIG. 8 includes a substrate 80, a silicon dioxide layer 81, a lower metal layer 82, a dielectric layer 83 and a top metal layer 84. The dielectric layer 83 could comprise, for example, tantalum oxide, barium-strontium titanate (BST) or any high dielectric constant material (similar to the trench capacitor cell).

The stacked capacitor illustrated in FIG. 8 functions in a similar manner as the trench capacitor discussed above. Therefore, the stacked capacitor will provide an accurate indication of charge accumulation through the emission of secondary electrons upon the application of a fine electron beam.

Since the function of the stacked capacitor illustrated in FIG. 8 is similar to the trench capacitor, a detailed discussion of the stacked capacitor's operation and structure is not presented for the sake of brevity. However, as would readily be known by one ordinarily skilled in the art in view of this disclosure, the stacked capacitor could include the antenna structures, tunnel oxides and resist layers, discussed above with respect to the trench capacitor in FIGS. 1(b)–3(b) and would produce the same advantages as the trench capacitor over the prior art structures.

Thus, as would be apparent to one ordinarily skilled in the art given this disclosure, the invention is applicable to all types of capacitor cells: trench, stacked, or combinations of both trench and stacked.

Figure 9:
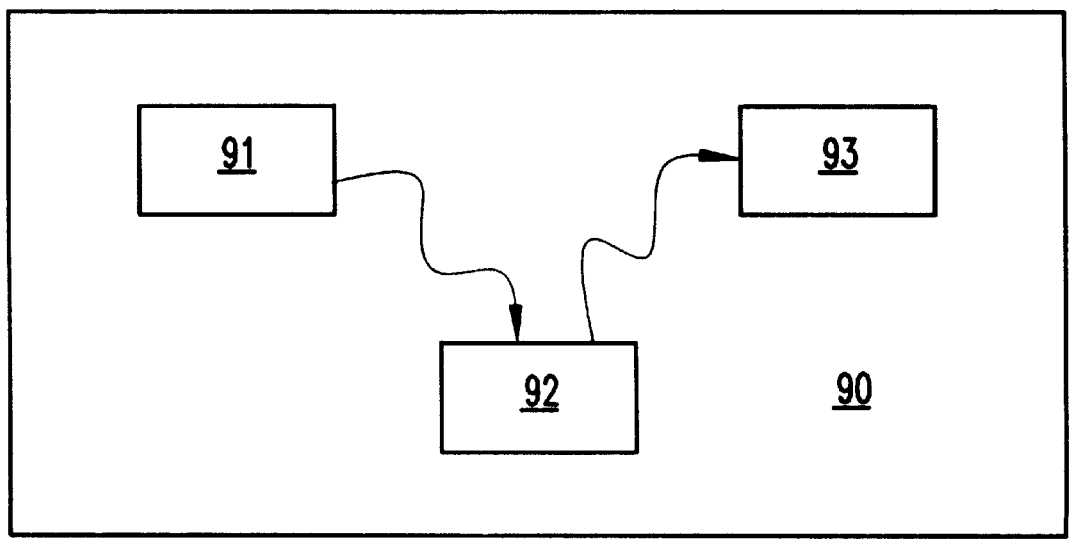
FIG. 9 a schematic diagram of a system of the invention.

A system of the invention is illustrated in FIG. 9. More specifically, FIG. 9 includes a deposition or etching chamber 90, an electron gun (emitter) 91, a sensor capacitor 92, and a collector (detector) 93.

As discussed above, the sensor capacitor 92 is placed within the chamber 90 during the deposition and etching processes. Further, during the etching and deposition processes, a fine electron beam is directed from the electron gun 91 to the capacitor 92. The capacitor 92 emits secondary electrons which are detected by the collector 93. The charge accumulation of the capacitor 92 is determined by the number and voltage of the secondary electrons detected by the collector 92.

The electron gun 91 corresponds to the assembly illustrated in FIG. 6. The collector 93 corresponds to the electronic analyzer illustrated in FIG. 7. The capacitor 92 corresponds to any of the trench capacitors illustrated in FIG. 1(a)–3(b) and the stacked capacitor illustrated in FIG. 8.

In conclusion, a fine electron beam can be used to measure the relative capacitance of any given area which is addressed by the electron beam; detect the presence of a charge at any given point; determine the relative magnitude of that charge; erase that charge if necessary; change the polarity of the charge; and partially erase the charge.

While the invention has been described in terms of preferred embodiments, those skilled in the art will recognize that the invention can be practiced with modification within the spirit and scope of the appended claims.

Having thus described our invention, what we claim as new and desire to secure by letters patent is as follows:

1. A system for detecting charge accumulation during semiconductor wafer manufacturing comprising:
    a sensor comprising a capacitor;
    an emitter for directing a primary electron beam toward said sensor, wherein said primary electron beam causes said sensor to emit secondary electrons; and
    a detector for measuring said secondary electrons.

2. The system as in claim 1, wherein an amount of said secondary electrons and an energy level of said secondary electrons indicates a charge accumulation of said sensor.

3. The system as in claim 1, wherein said emitter is for eliminating charge accumulation of said sensor.

4. The system as in claim 1, wherein said capacitor comprises at least one of a stacked capacitor and a trench capacitor.

5. A system for detecting charge accumulation during semiconductor wafer manufacturing comprising;
    a sensor comprising a capacitor;
    an emitter for directing a primary electron beam toward said sensor, wherein said primary electron beam causes said sensor to emit secondary electrons; and a detector for measuring said secondary electrons, wherein said capacitor comprises a trench capacitor and includes:
a substrate;
a trench within said substrate;
a first dielectric lining said trench;
an inner plate over said first dielectric and filling said trench; and
a second dielectric covering said substrate, wherein said inner plate extends through said second dielectric.

6. A system for detecting charge accumulation during semiconductor wafer manufacturing comprising:

a sensor comprising a capacitor;

an emitter for directing a primary electron beam toward said sensor, wherein said primary electron beam causes said sensor to emit secondary electrons; and a detector for measuring said secondary electrons, wherein said capacitor comprises a trench capacitor and includes:
a substrate;
a first dielectric over said substrate;
a first conductive layer over said first dielectric;
a second dielectric layer over said first conductive layer; and
a second conductive layer over said second dielectric layer.

7. The system as in claim 1, wherein said capacitor includes a tunneling oxide.

8. The system as in claim 1, wherein said capacitor includes a resist covering at least a portion of said capacitor.

9. The system as in claim 1, wherein said sensor has similar charging characteristics as a semiconductor wafer being manufactured during said semiconductor wafer manufacturing, such that charge accumulation of said sensor approximates charge accumulation of said wafer being manufactured.

10. A method for sensing charge accumulation on semiconductor wafers during production comprising:

positioning a sensor in a semiconductor wafer production chamber;

initiating a manufacturing process in said chamber;

directing a primary beam of electrons at said sensor during said manufacturing process, wherein said primary beam causes said sensor to emit secondary electrons; and measuring said secondary electrons emitted by said sensor.

11. The method as in claim 10, wherein said step of positioning said sensor comprises a step of positioning at least one of a stacked capacitor and a trench capacitor in said chamber.

12. The method as in claim 10, wherein said measuring step further comprises a step of determining a charge of said sensor based on an amount of said secondary electrons and an energy level of said secondary electrons.

13. The method as in claim 10, wherein said step of directing a primary electron beam comprises a first step of activating an electron gun and said method further comprises a second step of activating said electron gun for eliminating charge accumulation of said sensor.

14. A method for sensing charge accumulation on semiconductor wafers during production comprising:

positioning a sensor in a semiconductor wafer production chamber;

initiating a manufacturing process in said chamber;

directing a primary beam of electrons at said sensor during said manufacturing process, wherein said primary beam causes said sensor to emit secondary electrons; and measuring said secondary electrons emitted by said sensor, wherein said step of positioning said sensor comprises a step of positioning, in said chamber, a trench capacitor comprising:
a substrate;
a trench within said substrate;
a first dielectric lining said trench;
an inner plate over said dielectric and filling said trench;
a second dielectric covering said substrate, wherein said inner plate extends through said second dielectric.

15. A method for sensing charge accumulation on semiconductor wafers during production comprising:

positioning a sensor in a semiconductor wafer production chamber;

initiating a manufacturing process in said chamber;

directing a primary beam of electrons at said sensor during said manufacturing process, wherein said primary beam causes said sensor to emit secondary electrons; and measuring said secondary electrons emitted by said sensor, wherein said step of positioning said sensor comprises a step of positioning in said chamber, a stacked capacitor comprising:
a substrate;
a first dielectric over said substrate;
a first conductive layer over said first dielectric;
a second dielectric layer over said first conductive layer; and
a second conductive layer over said second dielectric layer.

16. The method as in claim 10, wherein said step of positioning said sensor comprises a step of positioning, in said chamber, a capacitor having a tunneling oxide.

17. The method as in claim 10, wherein said step of positioning said sensor comprises a step of positioning, in said chamber, a capacitor having a resist covering at least a portion of said capacitor.

18. The method as in claim 10, wherein said step of the measuring said secondary electrons comprises a step of comparing a number of said primary electrons directed toward said sensor and a number of said secondary electrons emitted by said sensor.

19. The method as in claim 10, wherein said step of positioning said sensor comprises a step of positioning, in said chamber, a capacitor having similar charging characteristics as a semiconductor wafer being manufactured in said chamber, such that charge accumulation on said sensor approximates charge accumulation on said wafer being manufactured.

20. The method as in claim 10, wherein said manufacturing process includes at least one of etching and deposition.

* * * * *